US008853553B2

(12) United States Patent
Hinton et al.

(10) Patent No.: US 8,853,553 B2
(45) Date of Patent: Oct. 7, 2014

(54) BALL GRID ARRAY (BGA) AND PRINTED CIRCUIT BOARD (PCB) VIA PATTERN TO REDUCE DIFFERENTIAL MODE CROSSTALK BETWEEN TRANSMIT AND RECEIVE DIFFERENTIAL SIGNAL PAIRS

(75) Inventors: Mark A. Hinton, Fort Collins, CO (US);
Minh V. Quach, San Jose, CA (US);
Regee Petaja, Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 109 days.

(21) Appl. No.: 13/548,234

(22) Filed: Jul. 13, 2012

(65) Prior Publication Data
US 2014/0014404 A1      Jan. 16, 2014

(51) Int. Cl.
*H05K 1/03*      (2006.01)
(52) U.S. Cl.
USPC ............................ 174/255; 174/261; 174/262
(58) Field of Classification Search
CPC ....... H05K 3/428; H05K 1/111; H05K 3/429;
H05K 1/112; H05K 1/115; H05K 2201/096;
H05K 1/0219; H05K 2201/09236; H05K
1/0237; H05K 2201/0715; H05K 1/0245;
H05K 2001/10734; H05K 1/0228; H05K
1/0298; H05K 1/025; H01L 2223/6638;
H01L 23/49827; H01L 23/49822; H01L
2223/6616

USPC .......... 174/250–268; 333/1, 4, 5, 12, 33, 246,
333/238
See application file for complete search history.

(56) References Cited

U.S. PATENT DOCUMENTS

| 6,908,340 | B1* | 6/2005 | Shafer ........................ 439/607.1 |
| 7,095,107 | B2 | 8/2006 | Ramakrishnan et al. |
| 7,407,413 | B2 | 8/2008 | Minich |
| 7,462,924 | B2 | 12/2008 | Shuey |
| 8,137,119 | B2 | 3/2012 | Stoner |
| 8,338,948 | B2* | 12/2012 | Weekly et al. ................. 257/738 |
| 2007/0269998 | A1* | 11/2007 | Daly et al. ...................... 439/70 |
| 2011/0007487 | A1* | 1/2011 | Muraoka ....................... 361/760 |

OTHER PUBLICATIONS

G. Showers et al., The Ripple Effect: Mezzanine Connector Options Proliferate to Meet Increased Bandwidths; Jun. 2, 2010.

* cited by examiner

*Primary Examiner* — Ishwarbhai B Patel

(57) ABSTRACT

A ball grid array (BGA) and via pattern includes a printed circuit board (PCB) having a surface on which a plurality of regions are formed and a transmit (TX) and receive (RX) cluster comprising a transmit differential signal pair and a receive differential signal pair formed using at least a portion of the plurality of regions on the surface of the PCB, the transmit differential signal pair and the receive differential signal pair comprising nodes arranged in a diagonal orientation in which each node of the receive differential signal pair is equidistant from each node of the transmit differential signal pair.

20 Claims, 4 Drawing Sheets

BALL GRID ARRAY (BGA) AND PRINTED CIRCUIT BOARD (PCB) VIA PATTERN TO REDUCE DIFFERENTIAL MODE CROSSTALK BETWEEN TRANSMIT AND RECEIVE DIFFERENTIAL SIGNAL PAIRS

BACKGROUND

A modern integrated circuit (IC) must meet very stringent design and performance specifications. In many applications for communication devices, transmit and receive signals are carried using a differential signal. A differential signal is one that is represented by two complementary signals on different conductors, with the term "differential" representing the difference between the two complementary signals. A "differential pair" is a communication methodology that uses two separate conductors (i.e., the differential pair) to carry a differential communication signal. All differential signals also have what is referred to as a "common mode," which represents the average of the two differential signals. One of the conductors carries a "true" or "positive" version of the differential communication signal while the other conductor carries the "complement" or "negative" version of the differential communication signal.

One of the design factors to be taken into account is the influence of signal cross-talk between two differential pairs of transmit and receive signal conductors. Signal cross-talk is the influence or intermingling of signal energy from one conductor to a nearby conductor. Cross-talk degrades the signal integrity and in extreme cases, can lead to errors in the communication channel. In a modern IC, the circuit device, also referred to as the "chip" is typically attached to a printed circuit board through the use of an intervening structure, sometimes referred to as an interposer or package. The circuit layout of the chip is typically a very dense two-dimensional array of conductors. The interposing structure acts as a mechanical and electrical interface to "spread out" the dense array of circuit contacts on the chip to a less dense array of contacts on the PCB. The chip is typically attached to the interposing structure using an array of fine pitch solder bumps. The interposing structure is typically attached to the PCB using an array of solder balls that is substantially less dense than the array of solder bumps that attach the chip to the interposing structure. The array of solder balls that attach the interposing structure to the PCB is referred to as a ball grid array (BGA) or a BGA pattern.

Previous attempts to minimize signal cross-talk between signals carried on differential pairs include assigning the differential pairs on the BGA layout with one or more power or ground conductors separating the two differential pairs so as to increase signal isolation and minimize crosstalk between the differential pairs. Unfortunately, this solution consumes valuable area on the PCB and may not be the most efficient use of the BGA pattern.

Therefore, it would be desirable to have a way to minimize differential signal cross-talk while maximizing the efficiency of a BGA layout.

SUMMARY

In an embodiment, a ball grid array (BGA) and via pattern includes a printed circuit board (PCB) having a surface on which a plurality of regions are formed and a transmit (TX) and receive (RX) cluster comprising a transmit differential signal pair and a receive differential signal pair formed using at least a portion of the plurality of regions on the surface of the PCB, the transmit differential signal pair and the receive differential signal pair comprising nodes arranged in a diagonal orientation in which each node of the receive differential signal pair is equidistant from each node of the transmit differential signal pair.

Other embodiments are also provided. Other systems, methods, features, and advantages of the invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

A ball grid array (BGA) and printed circuit board (PCB) via pattern to reduce differential mode crosstalk between transmit and receive differential signal pairs can be used in any integrated circuit (IC) in which it is desirable to increase signal isolation between differential signal pairs. Examples of integrated circuits that can use the BGA and PCB via pattern to reduce differential mode crosstalk between transmit and receive differential signal pairs include, but are not limited to, an application specific integrated circuit (ASIC), a central processing unit (CPU), an application specific standard product (ASSP), or any other chip or circuit that uses a BGA or similar connection interface. Increasing signal isolation between differential signal pairs reduces signal cross-talk between differential signal pairs and allows greater flexibility in assigning circuit traces and conductors in a BGA pattern and in a PCB via pattern. The ball grid array (BGA) and printed circuit board (PCB) via pattern to reduce differential mode crosstalk between transmit and receive differential signal pairs will be described below as being implemented in a particular IC package. However, the ball grid array (BGA) and printed circuit board (PCB) via pattern to reduce differential mode crosstalk between transmit and receive differential signal pairs can be implemented in any IC package where it is desirable to increase signal isolation between closely located conductors.

Figure 1:
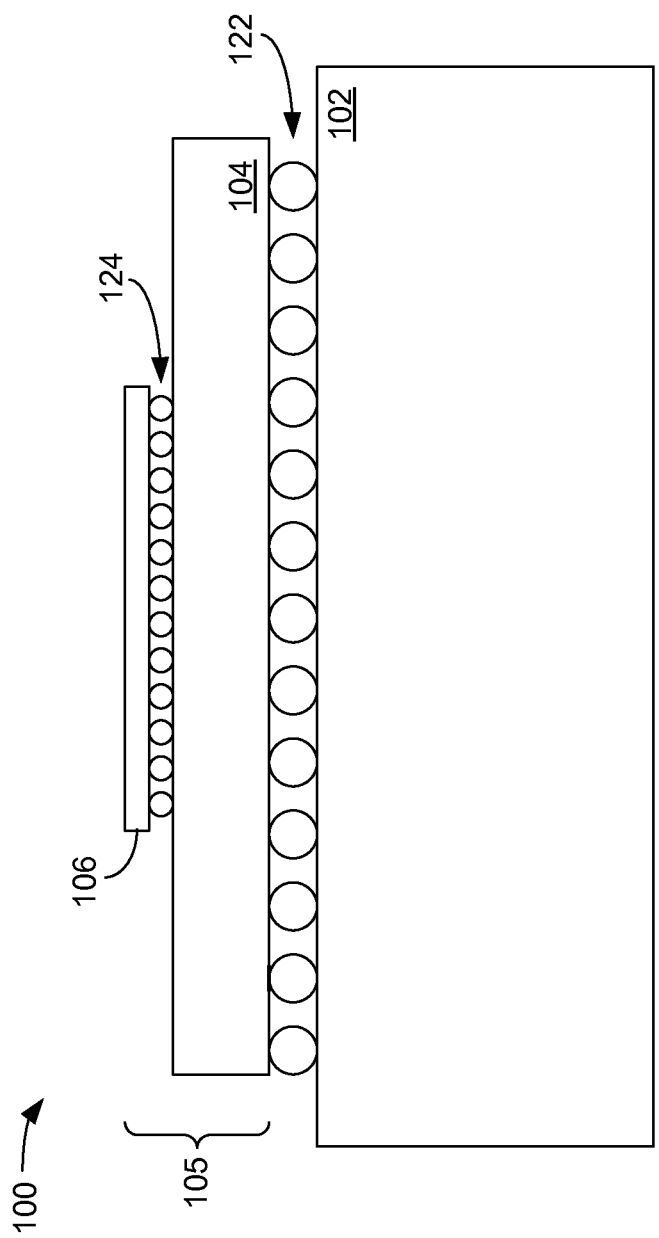
FIG. 1 is a schematic diagram illustrating a portion of an integrated circuit (IC) assembly in which the ball grid array (BGA) and printed circuit board (PCB) via pattern to reduce differential mode crosstalk between transmit and receive differential signal pairs can be implemented

FIG. 1 is a schematic diagram illustrating a portion of an integrated circuit (IC) assembly 100 in which the ball grid array (BGA) and printed circuit board (PCB) via pattern to reduce differential mode crosstalk between transmit and receive differential signal pairs can be implemented. The assembly 100 comprises a printed circuit board (PCB) 102 over which a circuit package 105 is located and attached to the PCB 102 using solder balls 122.

An example of a circuit package 105 can be a DRAM package or another circuit package. Further, the circuit package 105 can be a flip-chip package, or another circuit package as known to those skilled in the art. The PCB 102 can be any single-layer or multi-layer structure used to mount a circuit package, such as the circuit package 105 as known in the art. The solder balls 122 are an example of an attachment structure that can be used to electrically and mechanically attach the circuit package 105 to the PCB 102. The solder balls 122 are typically arranged in a grid layout where each solder ball corresponds to an electrical connection. The electrical connection can be a signal connection, a power connection or a ground connection.

The circuit package 105 comprises a circuit element, also referred to as a "chip" 106 located and attached to a laminate structure 104 using solder bumps 124. The laminate structure is also referred to as a "package substrate" or a "substrate." The chip 106 generally comprises the active circuit elements of the ASIC circuitry. The solder bumps 124 are an example of an attachment structure that can be used to electrically and mechanically attach the chip 106 to the laminate structure 104, and are known to those skilled in the art.

The laminate structure 104 generally comprises a laminate core and one or more layers formed on one or both sides of the laminate core. The laminate structure 104 acts as a mechanical and electrical interface to "spread out" the dense array of circuit contacts on the chip 106 to the less dense array of contacts on the PCB, represented by the solder balls 122. The chip 106 is typically attached to the laminate structure using an array of fine pitch solder bumps 124. The laminate structure 104 is typically attached to the PCB 102 using an array of solder balls 122. The array of solder balls 122 is substantially less dense than the array of solder bumps 124 that attach the chip 106 to the laminate structure 104. The array of solder balls 122 that attach the laminate structure 104 to the PCB is referred to as a ball grid array (BGA) or a BGA pattern.

The laminate structure 104 generally comprises a power distribution network and signal distribution connections, sometimes referred to as circuit traces, which transfer power and signal connections between the PCB 102 and the chip 106. Generally, the form factor and the array of solder bumps 124 of the chip 106 dictate that connection to the PCB 102 and the array of solder balls 122 occur through an adaptive connection. The laminate structure 104 serves this adaptive connection function of coupling the chip 106 to the PCB 102, and distributing the connections between the chip 106 and the PCB 102. The laminate structure 104 generally comprises one or more power layers, ground plane layers, and wiring interconnects. The laminate structure 104 may also include one or more passages, referred to as "vias" that provide electrical connectivity between and among the various layers of the laminate structure 104.

In the embodiment shown, the chip 106 is located over the laminate structure 104, and a periphery of the chip 106 is generally contained within the periphery of the laminate structure 104. Further, the laminate structure 104 is located over the PCB 102, and a periphery of the laminate structure 104 is generally contained within a periphery of the PCB 102.

Figure 2:
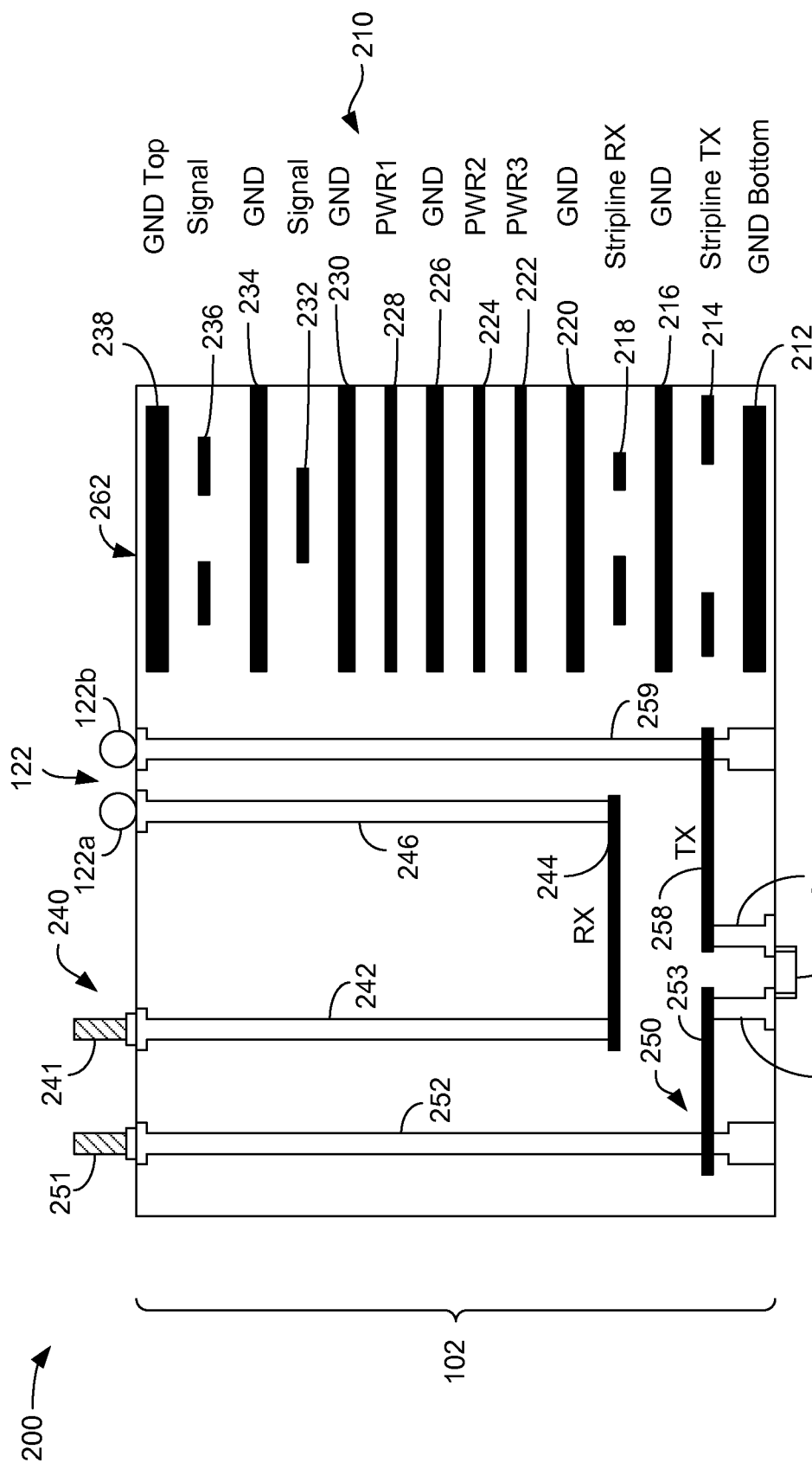
FIG. 2 is a schematic cross-sectional diagram illustrating a portion of the PCB of FIG. 1.

FIG. 2 is a schematic cross-sectional diagram 200 illustrating a portion of the PCB 102 of FIG. 1. FIG. 2 illustrates only a portion of the PCB 102 of FIG. 1 and is intended to show example elements of the PCB 102 that are relevant to the description of the ball grid array (BGA) and printed circuit board (PCB) via pattern to reduce differential mode crosstalk between transmit and receive differential signal pairs. The PCB 102 comprises a top surface 262, over which the solder balls 122 are arrayed.

The PCB 102 comprises a number of layers 210. The layers 210 generally comprise the laminate structure that forms the PCB 102. In the embodiment described herein, the layers 210 comprise a bottom ground layer 212, a stripline TX layer 214, a first intermediate ground layer 216, a stripline RX layer 218, a second intermediate ground layer 220, a power layer 222 labeled PWR3, a power layer 224 labeled PWR2, a third intermediate ground layer 226, a power layer 228 labeled PWR1, a fourth intermediate ground layer 230, a signal layer 232, a fifth intermediate ground layer 234, a signal layer 236 and a top ground layer 238. The layers 212 through 238 are shown for illustrative purposes only and may be arranged in a different order depending on the design and implementation of the PCB 102. Further, more or fewer layers may be implemented, depending on the design of the PCB 102 and the chip 106 (FIG. 1).

The example portion of the PCB 102 also comprises an example receive (RX) path 240 and an example transmit (TX) path 250. The RX path 240 represents one signal component of a receive signal differential pair, and the TX path 250 represents one signal component of a transmit signal differential pair.

The RX path 240 comprises a connector 241, a via 242, a signal conductor 244, a via 246 and a solder ball 122a. In an embodiment, the via 242 and the via 246 are referred to as "partial" or "blind" vias because they do not extend completely through the PCB 102. The signal conductor 244 comprises a portion of the stripline RX layer 218 described above. The connector 241 can be, for example, an SMA (subminiature version A) connector, as known to those skilled in the art.

The TX path 250 comprises a connector 251, a via 252, a signal conductor 253, a via 254, a capacitive element 256, a via 257, a signal conductor 258, a via 259 and a solder ball 122b. In an embodiment, the vias 254 and 257 are referred to as "partial" or "blind" vias because they do not extend completely through the PCB 102. The vias 252 and 259 are referred to as "through" vias or "plated through holes" because they extend completely through the PCB 102. The signal conductors 253 and 258 are portions of the stripline TX layer 214 described above. The connector 251 can be, for example, an SMA (subminiature version A) connector, as known to those skilled in the art.

Figure 3:
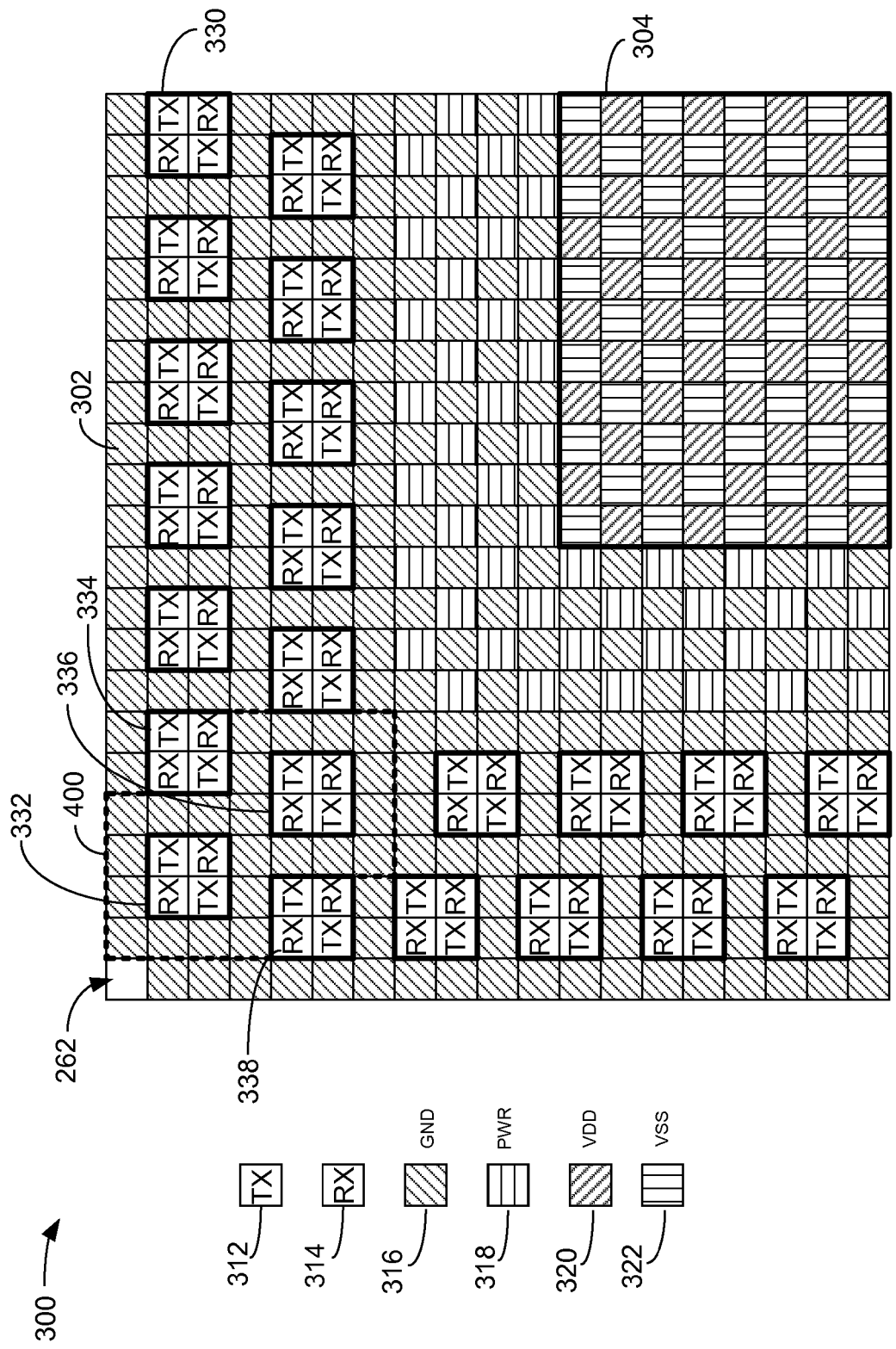
FIG. 3 is a plan view illustrating a portion of the surface of the PCB of FIG. 2.

FIG. 3 is a plan view illustrating a portion of the surface 262 of the PCB 102 of FIG. 2. In an embodiment, the portion comprises a quadrant 300 of an entire PCB 102. The quadrant 300 is generally divided into a plurality of areas that define regions 302 arrayed over the surface 262. In the embodiment shown in FIG. 3, there are 22 horizontal regions and 19 vertical regions forming the quadrant 300. Each region 302 may be assigned a particular functional connection. In the example shown in FIG. 3, each region 302 may be assigned one of six possible functional connections. For example, each region may be assigned as a transmit (TX) signal 312, a receive (RX) signal 314, a ground (GND) signal 316, a power (PWR) signal 318, a voltage VDD signal 320 and a voltage VSS signal 322.

The surface 262 is generally organized with the VSS and VDD functional connections being located in a portion 304. The VSS and VDD functional connections generally correspond to the core logic that would be associated with the chip 106 (FIG. 1). The transmit (TX) and receive (RX) signals are typically implemented as differential pair signals. A transmit differential pair and a receive differential pair are arranged in a diagonal format in what is referred to as a TX/RX cluster 330. A plurality of TX/RX clusters 330 are generally arranged along the top horizontal and side vertical periphery of the surface 262. Each TX/RX cluster 330 is generally separated from another TX/RX cluster 330 by at least one ground region 316. For example, TX/RX cluster 332 is separated from neighboring TXRX clusters 334, 336 and 338 by at least one ground region 316.

Figure 4:
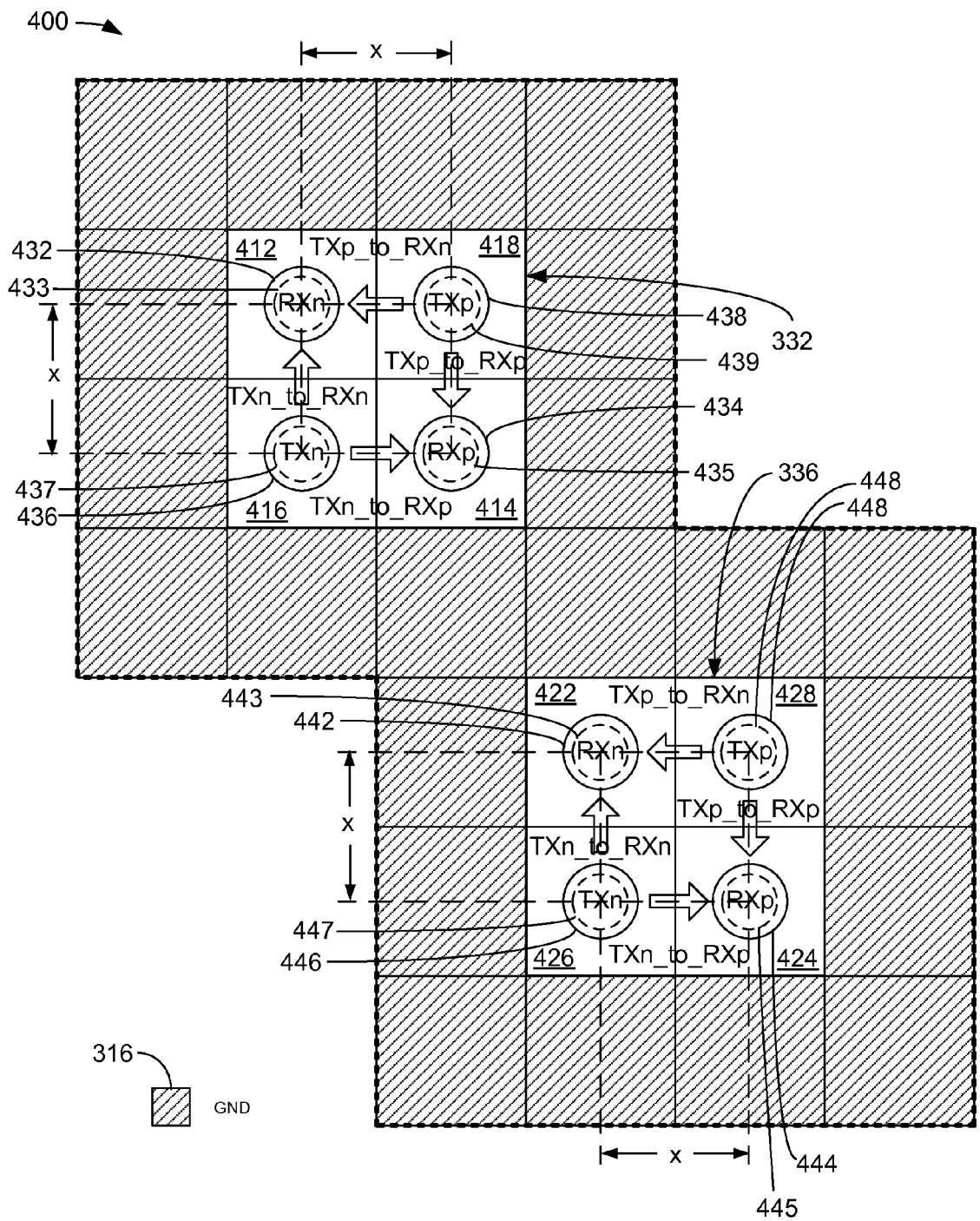
FIG. 4 is a plan view of a segment of the quadrant of FIG. 3.

FIG. 4 is a plan view of a segment 400 of the quadrant 300 of FIG. 3. The segment 400 comprises TX/RX cluster 332 and TX/RX cluster 336. The TX/RX cluster 332 is separated from the TX/RX cluster 336 by at least one ground region 316 (FIG. 3).

In accordance with an embodiment of the ball grid array and printed circuit board via pattern to reduce differential mode crosstalk between transmit and receive differential signal pairs, the TX/RX cluster 332 comprises a receive differential signal pair comprising RXn node 412 and RXp node 414; and comprises a transmit differential signal pair comprising TXn node 418 and TXp node 418. The nomenclature "p" refers to a "positive" or "true" signal and the nomenclature "n" refers to a "negative" or "complement" signal. The location of the "n" and "p" signals of each differential pair are arbitrary and can be reversed. Similarly, the location of the TX signals and RX signals within a TX/RX cluster 330 can be reversed.

The RXn node 412 comprises a solder ball 432 and a via 433. A pad (not shown) is typically associated with the via 433. The via 433, and the other vias described herein, can be a partial via or a through via. The RXp node 414 comprises a solder ball 434 and a via 435. A pad (not shown) is typically associated with the via 435. The TXn node 416 comprises a solder ball 436 and a via 437. A pad (not shown) is typically associated with the via 437. The TXp node 418 comprises a solder ball 438 and a via 439. A pad (not shown) is typically associated with the via 439. The RXn node 412, RXp node 414, TXn node 416 and the TXp node 418 are equidistant from each other and separated by a distance "x."

Similarly, the RXn node 422 comprises a solder ball 442 and a via 443. A pad (not shown) is typically associated with the via 443. The RXp node 424 comprises a solder ball 444 and a via 445. A pad (not shown) is typically associated with the via 445. The TXn node 426 comprises a solder ball 446 and a via 447. A pad (not shown) is typically associated with the via 447. The TXp node 428 comprises a solder ball 448 and a via 449. A pad (not shown) is typically associated with the via 449. The RXn node 422, RXp node 424, TXn node 426 and the TXp node 428 are also equidistant from each other and separated by the distance "x."

With respect to the TX/Rx cluster 332, the diagonal layout and equidistant spacing of the transmit and receive differential signal pair nodes minimizes differential mode crosstalk at the receive pair nodes, RXn 412 and RXp 414. For example, the cross talk appearing at the RXn node 412 comprises the crosstalk imparted by the TXp node 418 and the crosstalk imparted by the TXn node 416. Similarly, the cross talk appearing at the RXp node 414 comprises the crosstalk imparted by the TXp node 418 and the crosstalk imparted by the TXn node 416. Because of the physical symmetry of the diagonal layout of the RXn node 412 and the RXp node 414 being equidistant (separated by distance "x") from the TXp node 418 and the TXn node 416, the crosstalk imparted from the TXp node 418 to the RXn node 412 is equal to the crosstalk imparted from the TXp node 418 to the RXp node 414, and the crosstalk imparted from the TXn node 416 to the RXn node 412 is equal to the crosstalk imparted from the TXn node 416 to the RXp node 414. Accordingly, the crosstalk imparted to the RXn node 412 and to the RXp node 414, by the TXn node 416 and by the TXp node 418, is equal, and therefore, the difference in the crosstalk imparted to the RXn node 412 and to the RXp node 414 is net zero.

Similarly, with respect to the TX/RX cluster 336, the diagonal layout and equidistant spacing of the transmit and receive differential signal pair nodes minimizes differential mode crosstalk at the receive pair nodes, RXn 422 and RXp 424. For example, the cross talk appearing at the RXn node 422 comprises the crosstalk imparted by the TXp node 428 and the crosstalk imparted by the TXn node 426. Similarly, the cross talk appearing at the RXp node 424 comprises the crosstalk imparted by the TXp node 428 and the crosstalk imparted by the TXn node 426. Because of the physical symmetry of the diagonal layout of the RXn node 422 and the RXp node 424 being equidistant (separated by distance "x") from the TXp node 428 and the TXn node 426, the crosstalk imparted from the TXp node 428 to the RXn node 422 is equal to the crosstalk imparted from the TXp node 428 to the RXp node 424, and the crosstalk imparted from the TXn node 426 to the RXn node 422 is equal to the crosstalk imparted from the TXn node 426 to the RXp node 424. Accordingly, the crosstalk imparted to the RXn node 422 and to the RXp node 424, by the TXn node 426 and by the TXp node 428, is equal, and therefore, the difference in crosstalk imparted to the RXn node 422 and to the RXp node 424 is net zero.

This disclosure describes the invention in detail using illustrative embodiments. However, it is to be understood that the invention defined by the appended claims is not limited to the precise embodiments described.

What is claimed is:

1. A ball grid array (BGA) and via pattern, comprising:
   a printed circuit board (PCB) having a surface on which a plurality of regions are formed; and
   a transmit (TX) and receive (RX) cluster comprising a transmit differential signal pair and a receive differential signal pair formed using at least a portion of the plurality of regions on the surface of the PCB, the transmit differential signal pair comprising two nodes arranged in a diagonal orientation and the receive differential signal pair comprising two nodes arranged in a diagonal orientation, wherein each node of the receive differential signal pair is equidistant from each node of the transmit differential signal pair.

2. The ball grid array (BGA) and via pattern of claim 1, wherein a plurality of TX/RX clusters are separated by at least one ground region.

3. The ball grid array (BGA) and via pattern of claim 1, wherein each node of the differential signal pair is connected to a solder ball.

4. The ball grid array (BGA) and via pattern of claim 1, wherein each node of the differential signal pair comprises a via.

5. The ball grid array (BGA) and via pattern of claim 1, wherein each node of the receive differential signal pair being equidistant from each node of the transmit differential signal pair results in a net differential mode crosstalk of zero imparted to the receive differential signal pair.

6. The ball grid array (BGA) and via pattern of claim 5, wherein crosstalk appearing at each node of the receive differential signal pair comprises crosstalk from each node of the transmit differential signal pair.

7. The ball grid array (BGA) and via pattern of claim 1, wherein a plurality of TX/RX clusters are separated from core logic functional connections by at least one ground region.

8. The ball grid array (BGA) and via pattern of claim 1, wherein a plurality of TX/RX clusters are arranged around a periphery of a quadrant of the PCB.

9. A method for communicating using a ball grid array (BGA) and via pattern, comprising:
   providing a printed circuit board (PCB) to have a surface on which a plurality of regions are formed; and
   providing a transmit (TX) and receive (RX) cluster comprising a transmit differential signal pair and a receive differential signal pair using at least a portion of the plurality of regions on the surface of the PCB, the transmit differential signal pair comprising two nodes arranged in a diagonal orientation and the receive differential signal pair comprising two nodes arranged in a diagonal orientation, wherein each node of the receive differential signal pair is equidistant from each node of the transmit differential signal pair.

10. The method of claim 9, further comprising separating a plurality of TX/RX clusters by at least one ground region.

11. The method of claim 9, further comprising connecting each node of the differential signal pair to a solder ball.

12. The method of claim 9, wherein each node of the differential signal pair comprises a via.

13. The method of claim 12, wherein each node of the receive differential signal pair being equidistant from each node of the transmit differential signal pair results in a net differential mode crosstalk of zero imparted to the receive differential signal pair.

14. A ball grid array (BGA) and via pattern for a printed circuit board (PCB), comprising:
   a printed circuit board (PCB) having a surface on which a plurality of regions are formed; and
   a transmit (TX) and receive (RX) cluster comprising a transmit differential signal pair and a receive differential signal pair formed using at least a portion of the plurality of regions on the surface of the PCB, the transmit differential signal pair comprising two nodes arranged in a diagonal orientation and the receive differential signal pair comprising two nodes arranged in a diagonal orientation, wherein each node of the receive differential signal pair is equidistant from each node of the transmit differential signal pair, wherein a plurality of TX/RX clusters are separated by at least one ground region.

15. The ball grid array (BGA) and via pattern for a printed circuit board (PCB) of claim 14, wherein each node of the differential signal pair is connected to a solder ball.

16. The ball grid array (BGA) and via pattern for a printed circuit board (PCB) of claim 14, wherein each node of the differential signal pair comprises a via.

17. The ball grid array (BGA) and via pattern for a printed circuit board (PCB) of claim 14, wherein each node of the receive differential signal pair being equidistant from each node of the transmit differential signal pair results in a net differential mode crosstalk of zero imparted to the receive differential signal pair.

18. The ball grid array (BGA) and via pattern for a printed circuit board (PCB) of claim 17, wherein crosstalk appearing at each node of the receive differential signal pair comprises crosstalk from each node of the transmit differential signal pair.

19. The ball grid array (BGA) and via pattern for a printed circuit board (PCB) of claim 14, wherein a plurality of TX/RX clusters are separated from core logic functional connections by at least one ground region.

20. The ball grid array (BGA) and via pattern for a printed circuit board (PCB) of claim 14, wherein a plurality of TX/RX clusters are arranged around a periphery of a quadrant of the PCB.

* * * * *